(12) United States Patent
Lee et al.

(10) Patent No.: US 7,576,009 B2
(45) Date of Patent: Aug. 18, 2009

(54) METHOD FOR FORMING FINE PATTERN OF SEMICONDUCTOR DEVICE

(75) Inventors: Ki Lyoung Lee, Hwaseong-si (KR); Cheol Kyu Bok, Icheon-si (KR); Keun Do Ban, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/948,224

(22) Filed: Nov. 30, 2007

(65) Prior Publication Data
US 2008/0305642 A1    Dec. 11, 2008

(30) Foreign Application Priority Data
Jun. 5, 2007    (KR)    ............ 10-2007-0054974

(51) Int. Cl.
*H01L 21/027*    (2006.01)
(52) U.S. Cl. ........... 438/694; 438/695; 257/E21.023; 216/47
(58) Field of Classification Search ......... 257/E21.023, 257/E21.024, E21.033; 216/47, 49, 50; 438/694, 438/695
See application file for complete search history.

(56) References Cited

U.S. PATENT DOCUMENTS

| | | | | |
|---|---|---|---|---|
| 5,328,810 | A * | 7/1994 | Lowrey et al. | 430/313 |
| 6,117,785 | A * | 9/2000 | Lee et al. | 438/700 |
| 6,316,169 | B1 * | 11/2001 | Vahedi et al. | 430/329 |
| 7,026,099 | B2 | 4/2006 | Kato et al. | |
| 7,105,442 | B2 * | 9/2006 | Shan et al. | 438/681 |
| 2007/0020565 | A1 * | 1/2007 | Koh et al. | 430/313 |
| 2007/0082296 | A1 | 4/2007 | Yang et al. | |
| 2007/0128823 | A1 * | 6/2007 | Lee et al. | 438/396 |

FOREIGN PATENT DOCUMENTS

| | | |
|---|---|---|
| JP | 2003-316019 | 11/2003 |
| KR | 1020040060415 A | 7/2004 |
| KR | 1020070063319 A | 6/2007 |

OTHER PUBLICATIONS

Wolf et al., Silicon Processing for the VLSI Era, vol. 1—Process Technology, Second Edition, California: Lattice Press, 2000, p. 671-672, 676-677.*
Notice of Allowance in counterpart Korean Patent Application No. 2007-0054974, dated Nov. 18, 2008.

* cited by examiner

*Primary Examiner*—Matthew Smith
*Assistant Examiner*—Michele Fan
(74) *Attorney, Agent, or Firm*—Marshall, Gerstein & Borun LLP

(57) ABSTRACT

A method for forming a fine pattern of a semiconductor device comprises forming a deposition pattern including first, second, and third mask patterns over a semiconductor substrate having an underlying layer, side-etching the second mask pattern with the third mask pattern as an etching barrier mask, removing the third mask pattern, forming a spin-on-carbon layer that exposes the upper portion of the second mask pattern, performing an etching process to expose the underlying layer with the spin-on-carbon layer as an etching barrier mask, and removing the spin-on-carbon layer.

20 Claims, 9 Drawing Sheets

METHOD FOR FORMING FINE PATTERN OF SEMICONDUCTOR DEVICE

CROSS-REFERENCES TO RELATED APPLICATIONS

The priority benefit of Korean patent application number 10-2007-0054974, filed on Jun. 5, 2007, is hereby claimed and the disclosure thereof is incorporated herein by reference in its entirety.

BACKGROUND OF THE INVENTION

The present invention generally relates to a method for forming a fine pattern of a semiconductor device.

Due to the popularization of information media such as computers, semiconductor device technology has advanced rapidly. Semiconductor devices are required to operate at a high speed and to have a high storage capacity. As a result, manufacturing technology of semiconductor devices is required to manufacture a memory device of high capacity with improved integration, reliability and characteristics for accessing data.

In order to improve integration of the device, photolithography technology has developed to form fine patterns. The photolithography technology includes an exposure technology using chemically amplified Deep Ultra Violet (DUV) light sources such as ArF (193 nm) and VUV (157 nm), and a technology for developing photoresist materials suitable for the exposure light sources.

As a semiconductor device becomes smaller, it is important to control a critical dimension of a pattern line-width in the photolithography technology. Generally, the processing speed of semiconductor devices depends on the critical dimension of the pattern line-width. For example, as the line-width of the pattern is decreased, the processing speed is increased to improve device performance.

However, it is difficult to form a line/space pattern of less than 40 nm by a single exposure process in the photolithography process using an ArF exposer having a common numerical aperture of less than 1.2.

In order to improve resolution of photolithography technology and extend a process margin, a double patterning technology has been developed. The double patterning technology includes processes whereby a photoresist-coated wafer is respectively exposed by two masks, and then developed, thereby obtaining a complicated pattern, a dense pattern or an isolated pattern.

Since the double patterning technology uses two masks for patterning, the manufacturing cost and the turn-around-time are lower than those of a single patterning technology using a single mask, thereby degrading the throughput. When a pattern having a smaller pitch than a resolution limit of the exposer is formed in the cell region, illusory images are overlapped. As a result, the double patterning technology does not obtain a desired pattern. In alignment, overlays are mis-aligned.

SUMMARY OF THE INVENTION

Various embodiments of the present invention are directed at providing a method for forming a fine pattern of a semiconductor device which has a smaller pitch than a resolution limit of the exposer.

According to an embodiment of the present invention, a method for forming a fine pattern of a semiconductor device comprises forming a stack layer including first, second, and third mask films over a semiconductor substrate having an underlying layer. The photoresist pattern is formed on the third mask film. The third mask films are etched with the photoresist pattern as an etching barrier mask to form third mask patterns. The second and first mask films are etched with the third mask patterns as an etching barrier mask to form a first and second mask pattern. The second mask pattern is side-etched with the third mask pattern as an etching barrier mask. The third mask pattern is removed. A spin-on-carbon layer through which the upper portion of the second mask pattern is exposed is coated over first and second mask patterns and the underlying layer. A part of the first pattern and the second mask pattern are removed by the spin-on-carbon material as an etching barrier mask to expose the underlying layer. The spin-on-carbon layer is removed to obtain a fine first mask pattern having a uniform line-width.

The underlying layer can comprise a conductive layer with a stack pattern of an insulating film and a polymer layer as a top layer. The first and third mask films have a different etching selectivity ratio from that of the second mask film. For example, the first mask film is a tungsten layer. The second mask film preferably is selected from one or more of a silicon nitride film (SiN), a silicon oxide film (SiO), a silicon oxynitride film (SiON), and a stack layer including at least one or more films thereof. The third mask film preferably is selected from one or more of an amorphous carbon layer, a stack layer including an amorphous carbon layer and a silicon oxy-nitride film, and a multi mask film. The multi mask film preferably is formed by i) a spin-on-carbon material where a carbon element is present in an amount in a range of 85 wt % to 90 wt % based on the total compound molecular weight, or ii) the composition for mask comprising Si compound where a Si element is present in an amount in a range of 30 wt % to 80 wt % by weight based on the total compound molecular weight. The ii) Si compound preferably is selected from the group consisting of a Si-containing polymer, an oligomer of the Si-containing polymer and a spin-on glass (SOG) material such as Hydrogen Silses-Quioxane (HSQ) and Methyl Silses-Quioxane (MSQ).

The side-etching-the-second-mask-pattern step is performed by a trimming etching process. The trimming etching process has a higher polishing speed in the second mask film than that of first and third mask films. The trimming etching process is performed with an etching gas having a flow ratio of fluoro hydrocarbon (ex. CHxFy, here x and y are an integer ranging from 1 to 10): $SF_6$=2-10:1. Here, the fluoro hydrocarbon gas is a $CHF_3$ gas.

After the side-etching process is performed on the second mask pattern, the second mask pattern has a reduced line-width preferably by about 20-50%, specifically 30-40%, more specifically, 30-35% in comparison with that of the second mask pattern before the side-etching process is performed.

The removing-the-third-mask-pattern and the-spin-on-carbon-layer steps preferably are each performed by an oxygen ashing process. A ratio of line-width of the first mask pattern to interval between the first mask patterns is 1:1.

In one embodiment, a method for forming a fine pattern of a semiconductor device comprises forming a stack layer including first through third mask films over a semiconductor substrate having an underlying layer. The second and third mask films are etched to form a second and third mask patterns. The first mask film is partially etched with the second and third mask patterns as an etching barrier mask. The side-etching process is performed to the second mask film with the third mask pattern as an etching barrier mask. The third mask pattern is removed. A spin-on-carbon layer over which the upper portion of the second mask pattern is exposed is coated over first and second mask patterns and the underlying layer. A part of the first pattern and the second mask pattern are removed by the spin-on-carbon material as an etching barrier mask to expose the underlying layer. The spin-on-carbon layer is removed until the underlying layer and a portion of the first mask film are exposed.

The step of partially etching-the-first-mask-film preferably includes forming first mask patterns whose lower portions are interconnected not to expose an underlying pattern.

The method of the present invention can comprise a photoresist etching barrier mask process step which is performed once to form the mask patterns, thereby simplifying the manufacturing cost and process steps to improve efficiency.

According to an embodiment of the present invention, the method can improve the overlay mis-alignment due to overlapping of photoresist patterns, thereby obtaining a pattern having a pitch that cannot be formed by current lithography equipment.

DETAILED DESCRIPTION OF THE SPECIFIC EMBODIMENT

The present invention will be described in detail with reference to the accompanying drawings.

In order to prevent the overlapping and mis-alignment, i) a double exposure etch technology (DEET) and ii) a spacer patterning technology (SPT) are developed, which have been used in a semiconductor device producing process.

The i) DEET comprises forming a first pattern having a line-width twice larger than that of a desired pattern, and forming a second pattern having the same line-width between the first patterns. More specifically, the DDET includes a) a positive method and b) a negative method.

Figure 1:
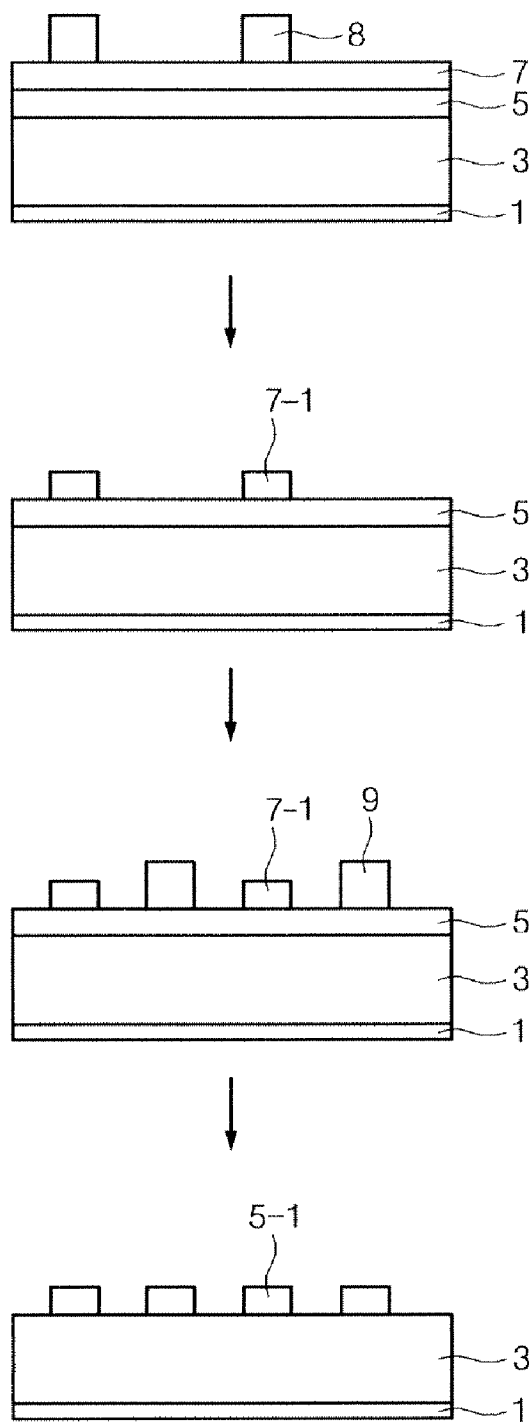
FIG. 1 is a diagram illustrating a conventional positive type double patterning method.

As shown in FIG. 1, in the a) positive method, an underlying layer 3, a first mask film 5, a second mask film 7 and a first positive photoresist pattern 8 are formed over a semiconductor substrate 1. A second mask pattern 7-1 is formed with the first photoresist pattern 8 as an etching barrier mask. A second positive photoresist pattern 9 is formed between the second mask patterns 7-1. A first mask pattern 5-1 is formed with the second mask pattern 7-1 and the second photoresist pattern 9 as an etching barrier mask.

Figure 2:
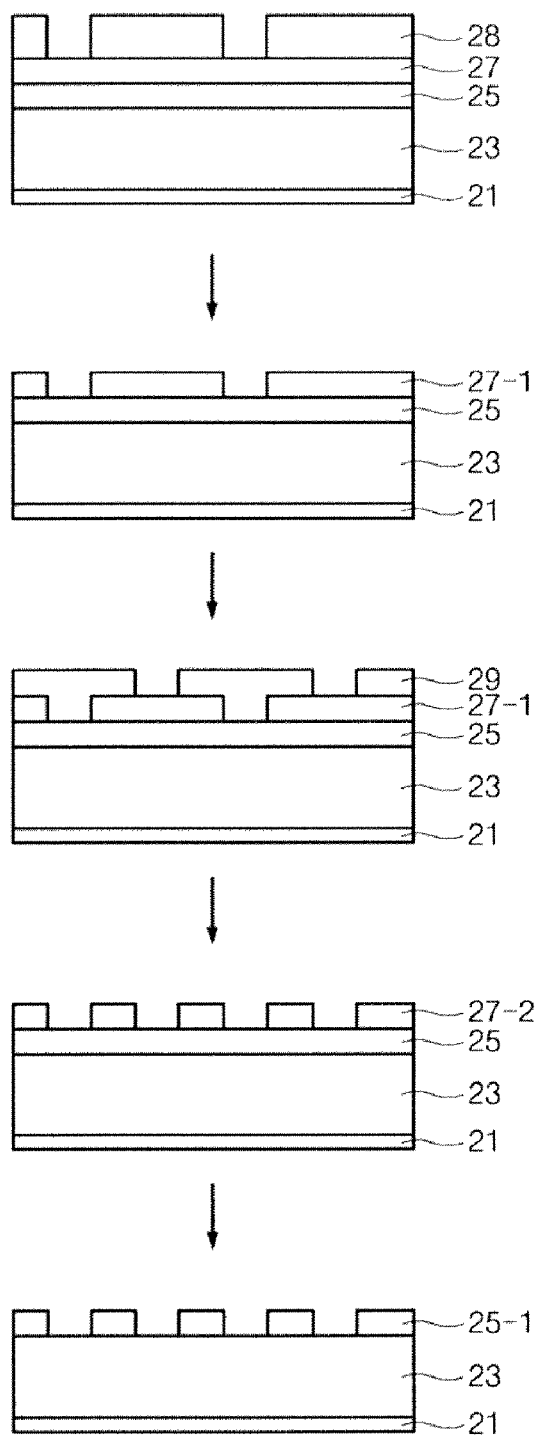
FIG. 2 is a diagram illustrating a conventional negative type double patterning method.

As shown in FIG. 2, in the b) negative method, an underlying layer 23, a first mask film 25, a second mask film 27 and a first negative photoresist pattern 28 are formed over a semi-conductor substrate 21. A second mask pattern 27-1 is formed with the first negative photoresist pattern 28 as an etching barrier mask. A second negative photoresist pattern 29 is formed over the second mask pattern 27-1 and the first mask film 25. The second mask pattern 27-1 is etched with the second negative photoresist pattern 29 as an etching barrier mask to form a second mask pattern 27-2. The first mask film 25 is etched with the second mask pattern 27-2 as an etching barrier mask to form a first mask pattern 25-1.

Since the DEET uses two kinds of masks, it is possible to form a pattern having a desired pitch size. However, the process steps are complicated, and the manufacturing cost is increased. Moreover, when the second photoresist pattern is formed, mis-alignment occurs by inaccuracy in overlay of patterns.

The ii) SPT is a self-alignment technology to prevent mis-alignment by performing a mask process for forming a pattern in a cell region. The SPT includes a) a positive method and b) a negative method.

Figure 3:
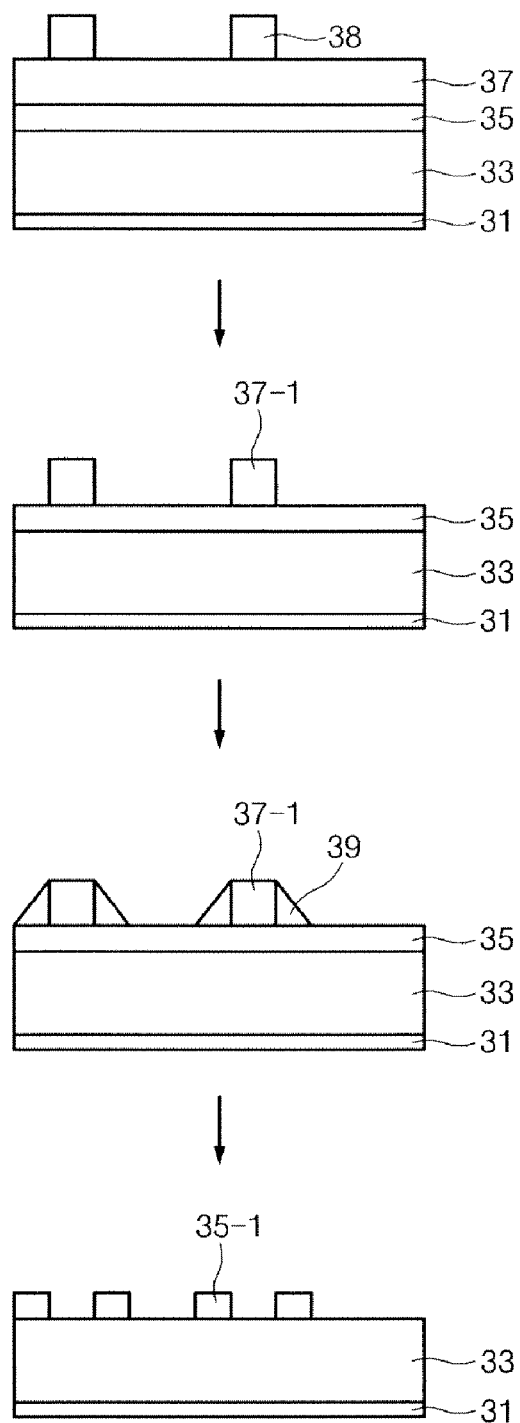
FIG. 3 is a diagram illustrating a conventional positive type spacer patterning method.

As shown in FIG. 3, in the a) positive method, an underlying layer 33, a first mask film 35, a second mask film 37 and a first photoresist pattern 38 are formed over a semiconductor substrate 31. A second mask pattern 37-1 is formed with the first photoresist pattern 38 as an etching barrier mask. A spacer 39 is formed at a sidewall of the second mask pattern 37-1. A first mask pattern 35-1 is formed with the spacer 39 as an etching barrier mask.

Figure 4:
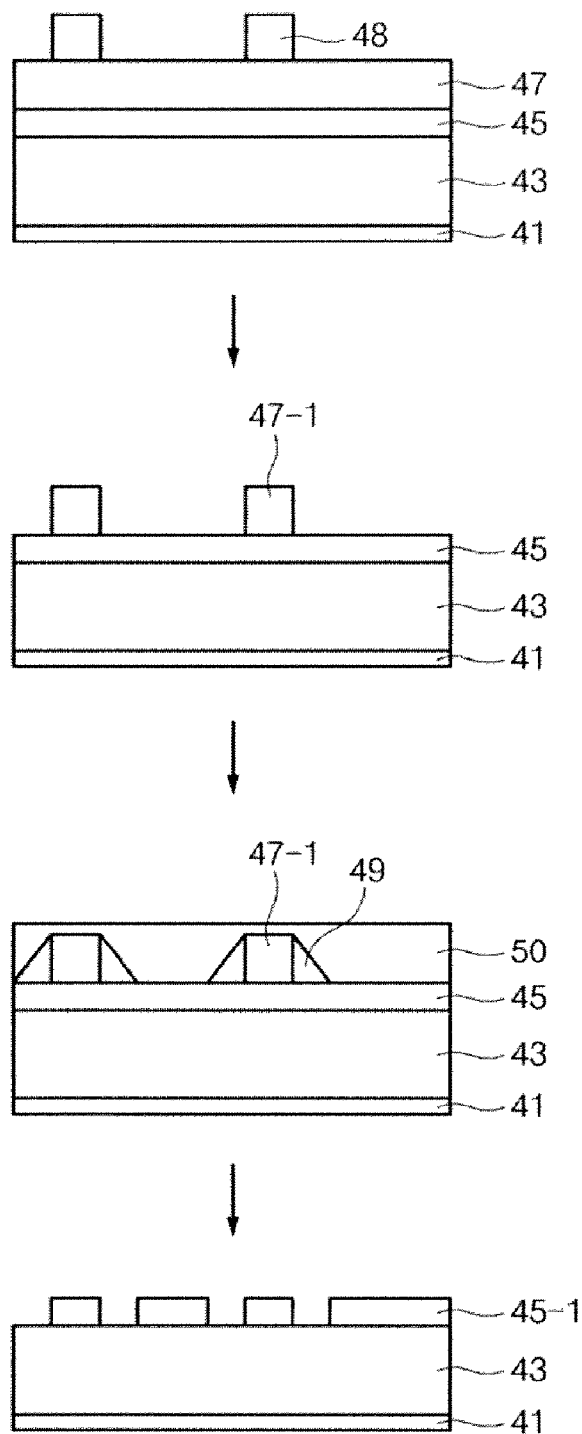
FIG. 4 is a diagram illustrating a conventional negative type spacer patterning method.

As shown in FIG. 4, the b) negative method includes forming an underling layer 43, a first mask film 45, a second mask film 47 and a first photoresist pattern 48 over a semiconductor substrate 41, and forming a second mask pattern 47-1 with the first photoresist pattern 48 as an etching barrier mask. A spacer 49 is formed at a sidewall of the second mask pattern 47-1. A spin-on-glass-film 50 or an anti-reflection film is coated over the resulting structure. A CMP or an etch-back method is performed to expose the second mask pattern 47-1 (not shown). The spacer is removed, and a first mask pattern 45-1 is formed with the second mask pattern 47-1 as an etching barrier mask.

The SPT requires an additional mask process in order to form a pattern in core and peripheral portions or isolate a pattern portion of a mini cell block region. As a result, the process steps are complicated. Also, it is difficult to regulate a line-width of the patterns when the spacer is formed, thereby degrading the uniformity of the pattern line-width.

FIGS. 5a through 5i are diagrams illustrating a method for forming a fine pattern of a semiconductor device according to an embodiment of the present invention.

Figure 5A:
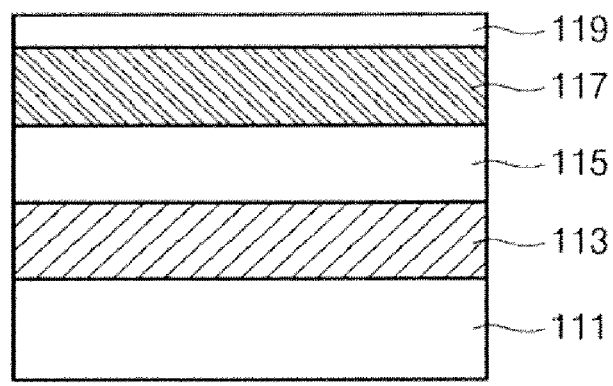
FIGS. 5a through 5i are diagrams illustrating a method for forming a fine pattern of a semiconductor device according to an embodiment of the present invention.

FIG. 5a shows first to third mask films 113, 115, and 117 and an organic anti-reflection film 119, respectively which are deposited sequentially over an underlying layer 111.

In this embodiment, the underlying layer is a conductive layer including a gate oxide film, a polysilicon layer, a tungsten layer and an insulating film. The insulating film has a stacked structure including a poly layer and the insulating film.

In this embodiment, the first mask film 113 includes tungsten (W). In this embodiment, the second mask film 115 includes a nitride film (SiN), an oxide film (SiO), a silicon oxy-nitride film (SiON), and a stack layer including at least one or more films thereof. In this embodiment, the third mask film 117 includes an amorphous carbon layer or a stack layer including the amorphous carbon layer and a silicon oxy-nitride film.

Preferably the first and third mask films have a different etching selectivity ratio from that of the second mask film. Preferably, the first and third mask films have one or both of a lower etching selectivity ratio and a lower etching speed, than that of the second mask film, and also preferably to all kinds of etching gas. More specifically, the first mask film preferably includes a tungsten film, the second mask film preferably includes a nitride film, and the third mask film preferably includes a stack layer including an amorphous carbon layer and a silicon oxy-nitride film.

The tungsten film used as the first mask film can be removed while being used as an etching barrier mask during a subsequent etching process for forming gate pattern. As a result, it is unnecessary to perform an additional process for removing the tungsten film.

The third mask film preferably includes a multi mask film which can be formed by a spin-coating process and has an excellent planarization property instead of the stack layer including an amorphous carbon layer and a silicon oxy-nitride film. The multi mask film does not use a chemical vapor deposition method like the amorphous carbon layer, and the efficiency is excellent.

Any kinds of multi mask films can be used. The multi mask film can serve as a mask film for improving an etching selectivity ratio and as an anti-reflection film for increasing pattern uniformity in a general process of manufacturing a semiconductor device. A preferred multi mask film is formed in a first embodiment by i) a spin-on-carbon material where a carbon element is present in an amount in a range of 85 wt % to 90 wt % based on the total compound molecular weight, or in a second embodiment ii) a mask composition comprising Si compound where a Si element is present in an amount in a range of 30 wt % to 80 wt % by weight based on the total compound molecular weight. The second embodiment ii) Si compound can be a Si-containing polymer, an oligomer of the Si-containing polymer and a SOG material such as HSQ and MSQ. More specifically, the mask composition preferably comprises a Si-containing polymer in an amount in a range of 30 parts by weight to 70 parts by weight based on 100 parts by weight of the composition and a residual organic solvent as main components. The mask composition preferably further comprises a compound of Formula 1, Formula 2, a thermal acid generator or a photoacid generator.

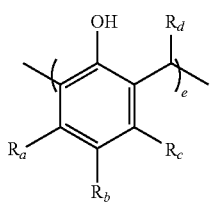

[Formula 1]

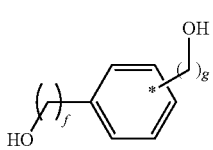

[Formula 2]

wherein $R_a$-$R_d$ are each individually hydrogen or a substituted or unsubstituted linear or branched $C_1$-$C_5$ alkyl group, e is an integer in a range of 5 to 500, f is an integer in a range of 0 to 5, and g is an integer in a range of 1 to 5.

The molecular weight of the compound of Formula 1 preferably is in a range of 500 to 50,000.

The molecular weight of the Si-containing polymer preferably is in a range of 300 to 30,000. The Si-containing polymer preferably includes one or more base resin selected from compounds of Formula 3 to 5.

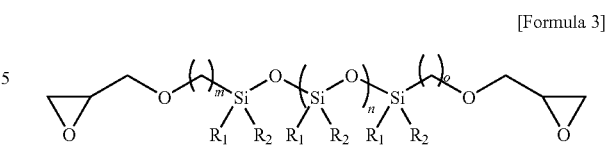

[Formula 3]

wherein $R_1$ and $R_2$ are individually hydrogen or a substituted or unsubstituted linear or branched $C_1$-$C_5$ alkyl group, and m, n and o are each independently an integer in a range from 1 to 10.

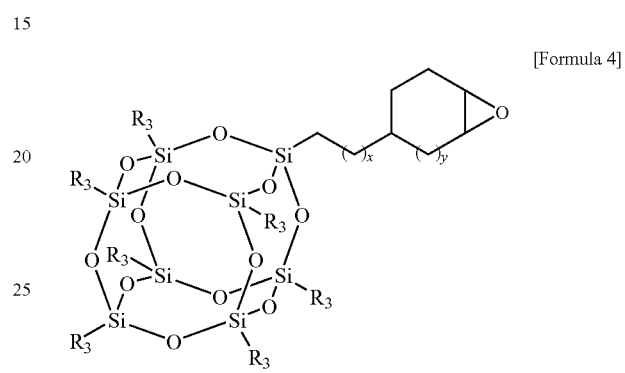

[Formula 4]

wherein $R_3$ is a hydrogen, a substituted or unsubstituted linear or branched $C_1$-$C_5$ alkyl group, a substituted or unsubstituted $C_3$-$C_8$ cyclo-alkyl group, or a substituted or unsubstituted $C_5$-$C_{12}$ aromatic group, and x and y each independently are an integer in a range of 0 to 5.

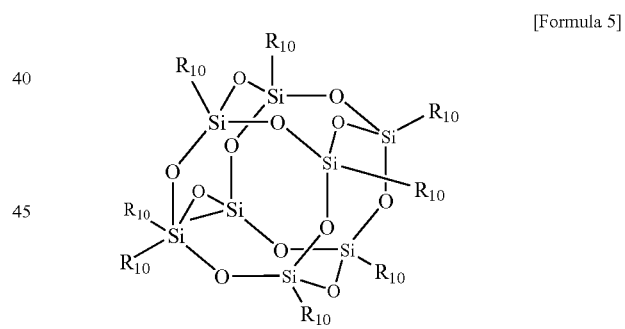

[Formula 5]

wherein $R_{10}$ is $(CH_2)_k Si(OR')_3$, R' is a hydrogen or a linear or branched $C_1$-$C_{10}$ alkyl, and k is an integer in a range of 1 to 10.

The spin-on-carbon material for the multi mask film preferably includes SHN18 of Nissan Chemical Co., or the Si compound for the multi mask film preferably includes MHNO4 of Nissan Chemical Co.

Figure 5B:
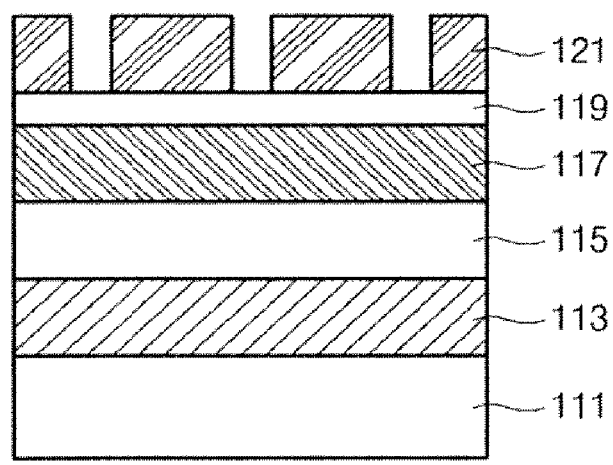

FIG. 5b shows a photoresist pattern 121 formed over the organic anti-reflection film 119 which is the top layer.

A photoresist film (not shown) is coated over the organic anti-reflection film, and a photolithography process is performed on the photoresist film to obtain the photoresist pattern 121. The pitch of the photoresist pattern 121 preferably is twice as large as that of the design rule. Preferably, the ratio of line-width of the photoresist pattern to interval between patterns is 3:1.

Figure 5C:
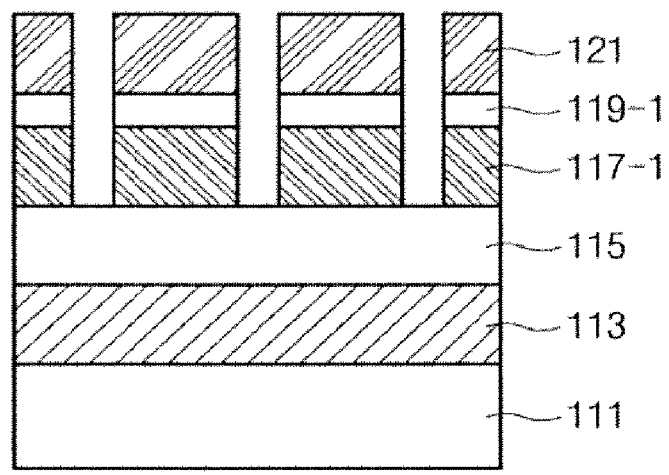

FIG. 5c shows a third mask pattern 117-1 and the organic anti-reflection pattern 119-1 formed with the photoresist pattern 121 as an etching barrier mask.

Figure 5D:
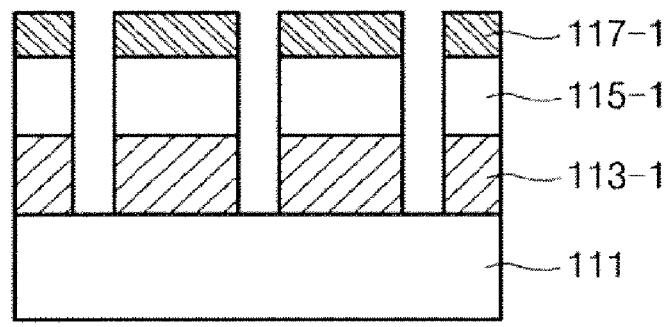
Figure 6A:
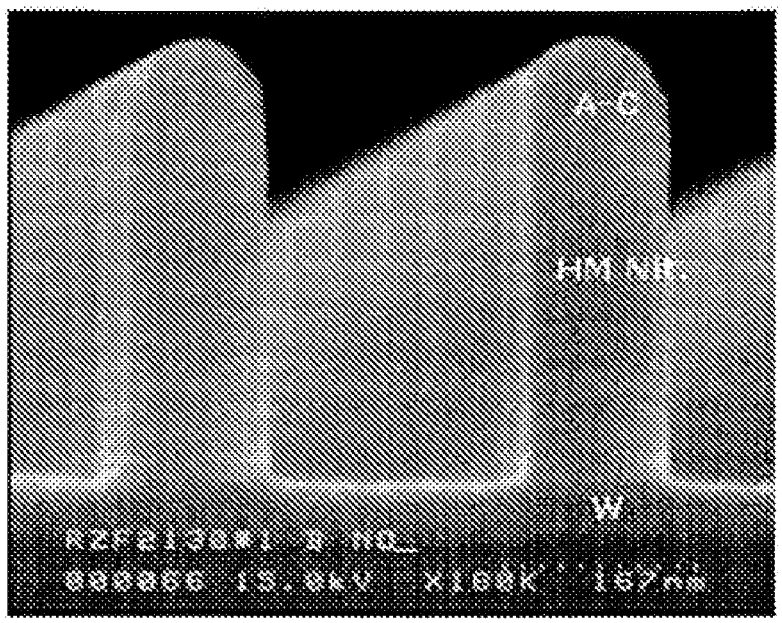
FIG. 6a is a SEM photograph illustrating the method of FIG. 5d.

FIG. 5d shows a second mask pattern 115-1 and a first mask pattern 113-1 which include an open part to expose the underlying layer 111 formed with the third mask pattern 117-1 and the organic anti-reflection pattern 119-1 as an etching barrier mask (see FIG. 6a, which shows an embodiment of the invention wherein the first mask pattern 113-1 is a tungsten layer, the second mask pattern 115-1 includes a deposition mask nitride film (HM Nit) including a nitride film (SiN) and a silicon oxy-nitride film (SiON) stack layer, and the third mask pattern 117-1 is an amorphous carbon (A-C) layer).

The etching process is performed to pattern the first and second mask films (113 and 115, respectively) until the underlying layer 111 is exposed with the third mask pattern 117-1 as an etching barrier mask. A partial etching process is performed on a top portion of the first mask film 113 not to expose the underlying layer, thereby forming a first mask pattern (not shown) whose bottom portion is connected. When the first mask pattern is formed whose bottom portion is connected, the first mask film preferably includes a tungsten or poly layer.

Figure 5E:
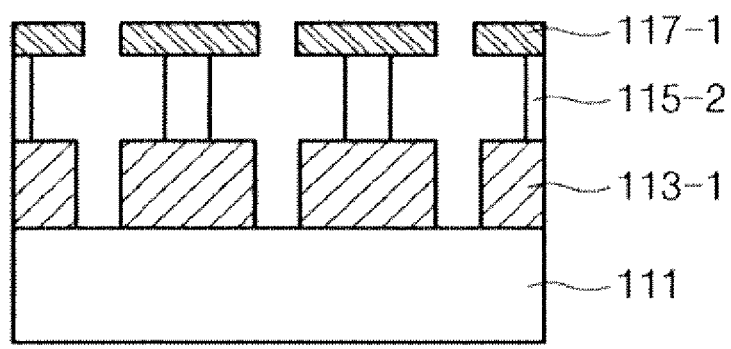

FIG. 5e shows a resulting structure obtained by performing a trimming process with the third mask pattern 117-1 as an etching barrier mask.

The trimming etching process is performed to regulate the pattern line-width uniformly in a logic process. The trimming etching process over-etches a lower material with an upper material as an etching barrier mask to adjust the line-width of the lower material. Here, the etching selectivity ratio of the lower material is not the same as an upper material. The trimming etching process is not performed in a conventional DRAM process.

The trimming etching process is performed with a large etching selectivity ratio difference of both the first and third mask films with the second mask film so that the sidewall of the second mask film can be etched uniformly without loss of the first and third mask films. That is, in the trimming etching process, the second mask film 115 has a higher etching speed than that of the first mask film 113 and also a higher etching speed than that of the third mask film 117 for a selected etching gas. As a result, the sidewall of the second mask pattern 115-1 is first etched and removed in the trimming etching process.

The trimming etching process preferably is performed with fluoro hydrocarbon gas (ex. CHxFy, here x and y are an integer ranging from 1 to 10) as a passivation etching gas to the tungsten and preferably with $SF_6$ gas to etch the nitride film. More preferably, the trimming etching process is performed with the etching gas having a flow ratio of $CHF_3$ gas:$SF_6$ gas=2-10:1, preferably, 4-5:1.

Figure 6B:
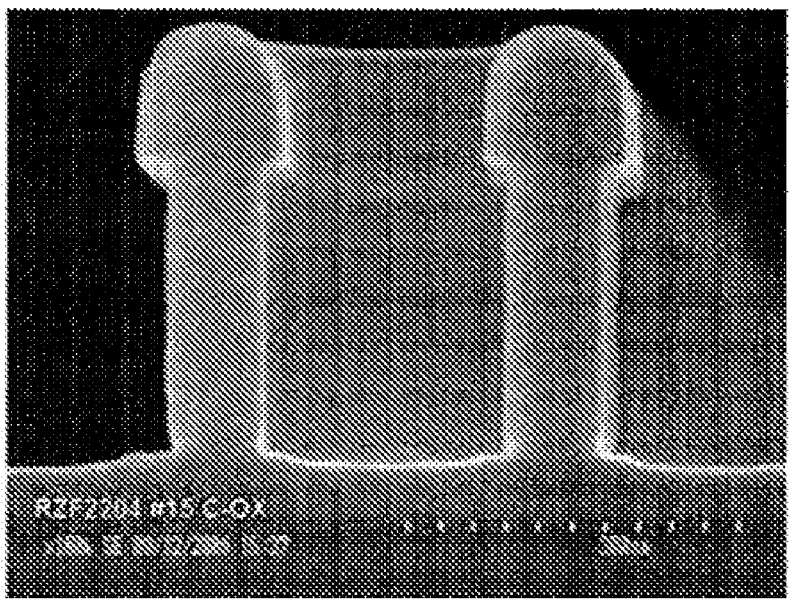
FIG. 6b is a SEM photograph illustrating the method of FIG. 5e.

The trimming etching process is performed until line-width of the second mask pattern 115-2 i) has the same size as a interval between the photoresist patterns, or ii) is reduced by about 20-50% of the line-width size of the second mask pattern 115-1 before the trimming etching process is performed (see FIG. 6b, which shows the second mask pattern reduced line-width size by about 20-50% after the trimming etching process is performed). The third mask pattern 117-1 is not damaged by the etching gas. Moreover, since the first mask pattern 113-1 whose bottom portion is connected (not shown) is formed by a partial etching process, although the underlying layer 111 is formed by an insulating film, the first mask pattern 113-1 which remains over the underlying layer serves as a barrier film to prevent the underlying layer 111 from being damaged by the etching gas.

Figure 5F:
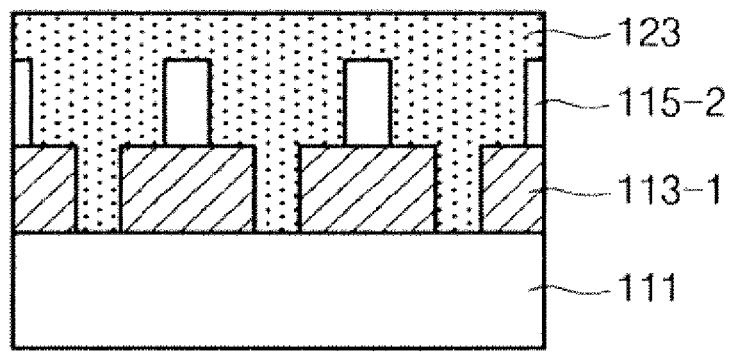

Referring to FIG. 5f, an $O_2$ ashing process is performed on the resulting structure to remove the residual third mask pattern 117-1.

A spin-on-carbon layer 123 is formed over the resulting structure. The spin-on-carbon layer preferably has a carbon element content present in an amount in a range of 85 wt % to 90 wt % based on the total molecular weight. Like the third mask film, SHN18 of Nissan Chemical Co. can be used.

Figure 5G:
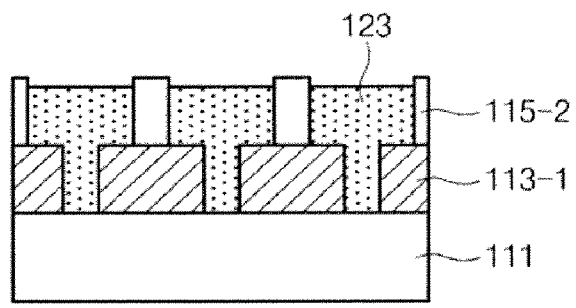

FIG. 5g shows a resulting structure where a top portion of the second mask pattern 115-2 is exposed by an etch-back process performed on the spin-on-carbon layer 123.

The etch-back process preferably is performed with an etching gas selected from oxygen, nitrogen, hydrogen and combination thereof.

In order to perform subsequent etching process in stable condition, the spin-on-carbon layer preferably is etched not to expose the first mask film pattern 113-1 disposed outside the bottom of the second mask pattern 115-2.

Figure 5H:
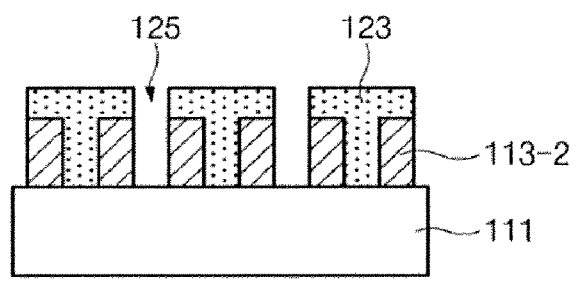

Referring to FIG. 5h, the exposed second mask pattern 115-2 and a part of the first mask pattern 113-1 situated under the exposed second mask pattern is removed with the spin-on-carbon layer 123 as an etching barrier mask to expose the underlying layer 111. As a result, a first mask pattern 113-2 including an open part 125 is formed.

The etching process preferably is performed with an etching gas for nitride or tungsten such as $SF_6$, $O_2$, $N_2$, Ar and combinations thereof.

The line-width of the first mask pattern 113-2 preferably is reduced to a size smaller than that of the first mask pattern 113-1 by about ⅓. When a developing inspection critical dimension (DICD) is transcribed as it is, the first mask pattern has the same size as a gap between the photoresist patterns. For example, when an etching bias is 80 nm and a design rule is a 40 nm device, the ratio of line-width of the first mask pattern to gap between first mask patterns is 1:1.

Figure 5I:
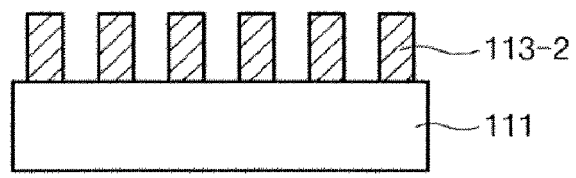

Referring to FIG. 5i, an $O_2$ ashing process is performed on the resulting structure to remove the spin-on-carbon layer 123.

When the bottom portion of the first mask pattern 113-1 is interconnected, the over ashing process is performed on the interconnection part of the first mask pattern 113-1 to expose the underlying layer, thereby obtaining a uniform fine pattern.

A lower conductive layer (not shown) is etched with the first mask pattern 113-2 as an etching barrier mask to form a conductive pattern. The conductive pattern can include a gate line, a bit line and a metal line. An additional mask process preferably is performed to form a pattern in core and peripheral parts except the cell region.

With an exposure mask pattern having a pitch twice as large as the design rule, a pattern having a reduced pitch can be formed. In comparison with a conventional double patterning technology using two masks, a self-aligned pattern can be obtained without overlay mis-alignment.

As described above, according to an embodiment of the present invention, a trimming process is performed to reduce a line-width of a mask pattern formed over an underlying layer. A spin-on-carbon material is coated over the resulting structure. A mask pattern is etched with the spin-on-carbon layer as an etching barrier mask to simplify process steps and obtain a fine pattern having a uniform line-width regardless of overlay accuracy of an exposer.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications will be obvious to a person of ordinary skill in the art in view of the present disclosure, and are intended to fall within the scope of the appended claims.

What is claimed is:

1. A method for forming a fine pattern of a semiconductor device, the method comprising:
    forming a stack film including a first mask film, a second mask film, and a third mask film over a semiconductor substrate having an underlying layer;
    forming a photoresist pattern over the third mask film;
    patterning the third mask film using the photoresist pattern as an etching barrier mask to form a third mask pattern;
    patterning the first and second mask films using the third mask pattern as an etching barrier mask to form a first and second mask patterns;
    side-etching the second mask pattern using the third mask pattern as an etching barrier mask;
    removing the third mask pattern;
    forming a spin-on-carbon layer over the second mask pattern so that an upper portion of the second mask pattern is exposed;
    performing an etching process to expose the underlying layer using the spin-on-carbon layer as an etching barrier mask so that the first mask pattern including an open part is formed; and
    removing the spin-on-carbon layer.

2. The method according to claim 1, wherein the underlying layer comprises a conductive layer with a stack pattern of an insulating film and a polymer layer as a top layer.

3. The method according to claim 1, wherein the first mask film has a different etching selectivity ratio from that of the second mask film, and the third mask film has a different etching selectivity ratio from that of the second mask film.

4. The method according to claim 1, wherein the first mask film is a tungsten layer.

5. The method according to claim 1, wherein the second mask film is selected from the group consisting of a silicon nitride film, a silicon oxide film, a silicon oxy-nitride film, and combinations thereof.

6. The method according to claim 1, wherein the third mask film is an amorphous carbon layer, a stack layer including an amorphous carbon layer and a silicon oxide nitride film, or a multi mask film.

7. The method according to claim 6, wherein the multi mask film is formed by a spin-on-carbon material where a carbon element is present in an amount in a range of 85 wt % to 90 wt % based on the total compound molecular weight, or a mask composition comprising a Si compound where a Si element is present in an amount in a range of 30 wt % to 80 wt % by weight based on the total compound molecular weight.

8. The method according to claim 7, wherein the multi mask film is formed by a mask composition comprising a Si compound selected from the group consisting of a Si-containing polymer, an oligomer of the Si-containing polymer and a spin-on glass material.

9. The method according to claim 8, wherein the spin-on glass material is Hydrogen Silses-Quioxane (HSQ) or Methyl Silses-Quioxane (MSQ).

10. The method according to claim 1, comprising side-etching the second mask pattern by a trimming etching process.

11. The method according to claim 10, wherein the trimming etching process has a higher polishing speed in the second mask film than that of either the first or the third mask film.

12. The method according to claim 10, further comprising performing the trimming etching process with an etching gas having a flow ratio of a fluorohydrocarbon gas to $SF_6$ of 2-10:1.

13. The method according to claim 12, wherein the fluorohydrocarbon gas is a $CHF_3$ gas.

14. The method according to claim 1, further comprising performing a side-etching process to reduce the line-width of the second mask pattern by 20-50% in comparison with that of the second mask pattern before reduction.

15. The method according to claim 14, further comprising performing a side-etching process to reduce the line-width of the second mask pattern by 30-40% in comparison with that of the second mask pattern before reduction.

16. The method according to claim 1, further comprising performing a step of removing the third mask pattern and the spin-on-carbon layer by an oxygen ashing process.

17. The method according to claim 1, further comprising performing the etching process using the spin-on-carbon layer as an etching barrier mask on the first and second mask patterns.

18. The method according to claim 1, wherein after removing the spin-on-carbon layer, a ratio of line-width of the first mask pattern to interval between the patterns is 1:1.

19. The method according to claim 1, wherein said patterning the first mask film comprises performing a partial etching onto the first mask film using the second and third mask patterns as an etching barrier mask; and performing an etching process to remove the spin-on-carbon layer and a portion of the first mask film until the underlying layer is exposed.

20. The method according to claim 19, wherein the partial etching onto the first mask film is performed so as not to expose the underlying layer, whereby forming first mask patterns whose lower portions are interconnected.

* * * * *